United States Patent
Bogner et al.

(10) Patent No.: US 7,948,694 B2
(45) Date of Patent: May 24, 2011

(54) APPARATUS FOR AN OPTOELECTRONIC DEVICE AND COMPONNENT HAVING AN OPTOELECTRONIC DEVICE AND AN APPARATUS

(75) Inventors: Georg Bogner, Lappersdorf (DE); Michael Hiegler, Mutlangen (DE); Monika Rose, Munich (DE); Günter Waitl, Regensburg (DE); Manfred Wolf, Kirchroth (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 439 days.

(21) Appl. No.: 11/574,055

(22) PCT Filed: Aug. 2, 2005

(86) PCT No.: PCT/DE2005/001363
§ 371 (c)(1),
(2), (4) Date: Nov. 10, 2008

(87) PCT Pub. No.: WO2006/021179
PCT Pub. Date: Mar. 2, 2006

(65) Prior Publication Data
US 2009/0212306 A1     Aug. 27, 2009

(30) Foreign Application Priority Data

Aug. 23, 2004   (DE) .................. 10 2004 040 763
Oct. 21, 2004   (DE) .................. 10 2004 051 379

(51) Int. Cl.
G02B 7/02   (2006.01)

(52) U.S. Cl. ........................ 359/819; 359/822

(58) Field of Classification Search .......... 359/694–700, 359/811–824; 438/27–116
See application file for complete search history.

(56) References Cited

U.S. PATENT DOCUMENTS

| | | | |
|---|---|---|---|
| 3,887,803 A | 6/1975 | Savage, Jr. | |
| 4,474,306 A | 10/1984 | Nakauchi et al. | 403/375 |
| 4,742,235 A * | 5/1988 | Koji | 607/90 |
| 5,302,778 A | 4/1994 | Maurinus | |
| 5,497,004 A | 3/1996 | Rudolph et al. | |
| 6,204,523 B1 | 3/2001 | Carey et al. | |
| 6,274,924 B1 | 8/2001 | Carey et al. | |
| RE37,554 E | 2/2002 | Brunner et al. | |
| 6,483,101 B1 | 11/2002 | Webster | |
| 6,610,563 B1 | 8/2003 | Waitl et al. | |
| 6,845,118 B1 * | 1/2005 | Scott | 372/96 |
| 6,933,584 B2 * | 8/2005 | Miyazaki et al. | 257/432 |
| 2002/0006687 A1 | 1/2002 | Lam | |

(Continued)

FOREIGN PATENT DOCUMENTS

CN    1405893    3/2003

(Continued)

OTHER PUBLICATIONS

Authorized officer: Heising, S.., *International Search Report*, PCT/DE2005/001363, Nov. 1, 2005.

(Continued)

*Primary Examiner* — Mohammed Hasan
(74) *Attorney, Agent, or Firm* — Fish & Richardson P.C.

(57) ABSTRACT

An apparatus having a least one fixing element is specified, the fixing element being provided for fixing the apparatus to a housing body of an optoelectronic device and the apparatus being designed as a mount for a separate optical element.

24 Claims, 4 Drawing Sheets

U.S. PATENT DOCUMENTS

| | | | |
|---|---|---|---|
| 2003/0160314 A1* | 8/2003 | Crane et al. | 257/680 |
| 2004/0075100 A1 | 4/2004 | Bogner et al. | |
| 2004/0183081 A1 | 9/2004 | Shishov et al. | |
| 2004/0232435 A1 | 11/2004 | Hofer et al. | |

FOREIGN PATENT DOCUMENTS

| | | |
|---|---|---|
| DE | 20314966 | 1/2004 |
| EP | 0585186 | 3/1994 |
| EP | 0886322 | 12/1998 |
| JP | 04119178 | 4/1992 |
| JP | 10-233532 | 9/1998 |
| JP | 11-103040 | 4/1999 |
| JP | 2003-004979 | 1/2003 |
| JP | 2003-163382 | 6/2003 |
| JP | 2004-037175 | 2/2004 |
| WO | WO 02/084749 | 10/2002 |

OTHER PUBLICATIONS

Examination Report for Chinese Patent Application No. 200580036249.7 dated Nov. 21, 2008.

English language translation of CN 14305893, dated Aug. 23, 2005 by Miyazaki et al.

* cited by examiner

APPARATUS FOR AN OPTOELECTRONIC DEVICE AND COMPONNENT HAVING AN OPTOELECTRONIC DEVICE AND AN APPARATUS

CROSS-REFERENCE TO RELATED APPLECATIONS

This application is the National Stage of International Application No. PCT/DE2005/001363, filed on Aug. 2, 2005, which claims the priority to German Patent Applications Serial No. 10 2004040763.0, filed on Aug. 23, 2004 and Serial No. 10 2004051379.1, filed on Oct. 21, 2004. The contents of all applications are hereby incorporated by reference in their entireties.

FIELD OF THE INVENTION

The invention relates to an apparatus for an optoelectronic device and to a component having this apparatus and an optoelectronic device.

BACKGROUND OF THE INVENTION

For beam shaping in conventional optoelectronic devices, a lens is often arranged downstream of a semiconductor chip of the device. Said lens is adhesively bonded onto a encapsulation protecting the semiconductor chip, for example. However, such an adhesive-bonding connection is often not stable with respect to deformations of the encapsulation or the action of radiation, thereby increasing the risk of an impaired optical linking of the optical element to the semiconductor chip. Furthermore, lenses used in conventional optoelectronic devices often degrade under short-wave, in particular ultraviolet or blue, radiation, which may be manifested for example by obfuscation, discolorations or deformations of the lens.

SUMMARY OF THE INVENTION

It is an object of the invention to specify an apparatus which facilitates the fixing of an optical element, in particular of an optical element that is stable with respect to short-wave radiation, to an optoelectronic device. Furthermore, it is an object of the invention to specify a component having an apparatus of this type.

An apparatus according to the invention comprises at least one fixing element, the fixing element being intended or provided for fixing the apparatus to a housing body of an optoelectronic device and the apparatus being designed as a mount for a separate optical element.

An apparatus of this type advantageously facilitates the fixing of the optical element for beam shaping to the housing body of the optoelectronic device by means of the apparatus and the optical element can be chosen comparatively freely. In particular, it is possible in this way to use optical elements having an advantageously high stability with respect, to short-wave, in particular blue or ultraviolet, radiation in simplified fashion with optoelectronic devices. In particular, the optical element may foe stable with respect to radiation for the generation of which or for the reception of which the optoelectronic device is intended or provided.

It is possible, in particular, to employ optical elements containing materials which are conventionally regarded as difficult to use—e.g. with regard to the fixing to the device and simultaneous radiation stability—together with optoelectronic devices, for instance devices designed for short-wave radiation. In the case of conventional components, therefore, in contrast to the invention, it is often necessary to make compromises in the selection of the optical element.

The optical element is held by the apparatus, which can in turn foe fixed to the housing body of the optoelectronic device. The apparatus can thus be specially optimized as a mount or for fixing to the housing body, and the optical element for beam shaping of radiation that is to foe received or generated by a semiconductor chip, e.g. a photodiode chip or an LED chip, of the optoelectronic device.

In one preferred refinement of the invention, the optical element and/or the apparatus is dimensionally stable under the action of short-wave radiation. In particular, the optical element may be stable in this way with respect to radiation for the generation of which or for the reception of which the optoelectronic device is intended or provided.

In a further preferred refinement of the invention, the optical element is stable with respect to obfuscation or discolorations under the action of radiation, in particular short-wave radiation, which, in the case of conventional optical elements, often occur on account of an action of high-energy short-wave radiation. In particular, the optical element may be stable in this way with respect to radiation for the generation of which or for the reception of which the optoelectronic device is intended or provided.

In particular, the optical element may be designed to be stable with respect to a permanent action of short-wave radiation having a comparatively high intensity, which may occur e.g. in the case of high-power luminescence diode devices. The risk of a radiation-dictated change in the beam shaping properties or the transmission of the optical element can thus be reduced overall—over the service life of the optoelectronic device.

In a further preferred refinement of the invention, the optical element contains a glass, an epoxide material, a thermoplast, a polymer, or urethane. Polymer-containing elements may be formed for example as a plurality of polymer layers arranged on a carrier, preferably a glass carrier. The optical element may also contain a reaction resin, for instance an epoxy resin or an acrylic resin, silicone resins or a silicone. The optical element may furthermore he coated with an antireflection layer.

In a further preferred refinement of the invention, the optical element is a refractive element, a diffractive element or a dispersive element, The beam shaping is effected by refraction, if appropriate by means of a location-dependent refractive index (GRIN: GRaded INdex), in the case of refractive elements, by diffraction in the case of diffractive elements and by the wavelength dependence of the refractive index in the case of dispersive elements. If appropriate, the optical element may be designed as a holographic or geometrical optic. A geometrical optic is understood to be, in particular, a refractive or reflective optical element that utilizes a corresponding shaping of refractive or reflective areas (surfaces) of the element for beam shaping, In particular, an optic of this type may be handled according to the principles of geometrical optics. A holographic optic is understood to be, in particular, an element appertaining to physical optics which utilizes the wave nature of radiation for beam shaping and, accordingly, essentially cannot be handled, or can be handled only with very great difficulty, in the context of geometrical optics. An optic of this type may for example replace a geometrical optical element, for instance a mirror or a lens. Holographic optical elements can furthermore often be produced more cost-effectively compared with corresponding geometrical, optics.

By way of example, the optical element is designed as a lens, for instance a diffractive or refractive lens, or a reflector, preferably in each case with a focus or focal range which is assigned to a semiconductor chip of the optoelectronic device.

In accordance with a further preferred refinement of the invention, the optical element is reversibly or irreversibly fixed to the apparatus. A reversible fixing facilitates the exchange of an optical element in the case where an apparatus is already fixed to the housing body of an optoelectronic device, whereas an irreversible fixing is distinguished by increased mechanical loadability.

In a further preferred refinement of the invention, the apparatus comprises a frame intended for receiving the optical element. By way of example, the frame has in plan view a circular or polygonal, in particular quadrangular or hexagonal, enveloping basic form or a circular or polygonal, in particular quadrangular or hexagonal, contour.

The frame may have, preferably on the inner side, a mount apparatus designed for fixing the optical element to the apparatus.

Preferably, a groove is formed in the frame, particularly preferably a peripheral groove on the inner side, a projection of the optical element engaging into said groove. The stability of the fixing of the optical element to the apparatus can thus be increased. However, a mount apparatus different from a groove, for example a latching apparatus, which facilitates a releasable fixing of the optical element to the apparatus, may be provided at the frame for fixing the optical element, which preferably has a mount element designed in accordance with the respective mount apparatus.

In a further preferred refinement of the invention, the apparatus is produced by means of injection moulding, compression moulding or transfer moulding with a suitable moulding compound, preferably containing a plastic. Methods of this type are particularly suitable for producing large numbers of apparatuses.

In a further preferred refinement of the invention, the fixing element is arranged at and/or fixed to the frame. The fixing element may be embodied for example like a pin.

In one advantageous development of the invention, the apparatus is formed in one piece. In particular, frame and fixing element may be formed in a continuous structure, thereby advantageously increasing the stability of the connection of fixing element and frame and simplifying the production of the apparatus.

In a further preferred refinement of the invention, the apparatus comprises a plurality of fixing elements, preferably of identical type. The stability of the fixing of the apparatus to the housing body can advantageously be increased by means of a plurality of fixing elements. The fixing elements are preferably arranged in the corner regions of the frame in the case of a polygonal basic form or contour. The number of fixing elements particularly preferably corresponds to the number of corners. Given a circular basic form of the frame, a number of three or four fixing elements has proved to be sufficient.

A component according to the invention comprises an optoelectronic device and an apparatus according so the invention, the optoelectronic device comprising at least one semiconductor chip and a housing body.

The semiconductor chip may be designed as a luminescence diode chip or photodiode chip, in particular for generation of radiation or for reception of radiation in the visible, infrared or ultraviolet spectral range. The optical element preferably serves for the beam shaping of radiation that is incident on the semiconductor chip or is generated by the semiconductor chip.

In a further preferred refinement of the invention, the component and/or the optoelectronic device is of surface-mountable design (SMD; Surface Mountable Device), for example for mounting on a printed circuit board, preferably by means of soldering.

In one advantageous development of the invention, the apparatus is fixed to the housing body of the device after the mounting of the optoelectronic device on a printed circuit board. This facilitates the use of materials for the apparatus and/or the optical element which, such as thermoplastic materials for example, tend toward deformation at typical soldering temperatures.

In a further advantageous development of the invention, the apparatus, preferably with the optical element held by the apparatus, is fixed to the housing body of the optoelectronic device prior to the mounting of the component. If appropriate, the optical element may also be arranged in the mount after the fixing of the apparatus to the housing body.

The apparatus is preferably adapted to the form of the housing body. The housing body and the apparatus or the frame particularly preferably have, in particular in plan view, a similar, preferably matching, enveloping basic form or contour. An automatic placement machine for positioning the components on a printed circuit board can be advantageously operated, compared with a different type of shaping of the apparatus, with respect to populating a printed circuit board with optoelectronic devices, without any critical change in the process parameters—for instance parameters for identifying a component.

In a further preferred refinement of the invention, the semiconductor chip is provided or intended for the radiation generation of short-wave radiation, in particular in the blue or ultraviolet spectral range. A peak wavelength of the radiation to be generated by the semiconductor chip preferably lies in a wavelength range of less than 527 nm, particularly preferably less than 500 nm or less than 480 nm. In the case of conventionally used lenses, such short-wave radiation may already lead to degradation phenomena which can advantageously be reduced on account of the apparatus, which is distinguished by high flexibility with regard to the optical element that can be used.

By means of the apparatus with an optical element that is stable with respect to short-wave radiation, it is possible, in the case of a component, to achieve in simplified fashion an efficient, permanently stable beam shaping of a radiation generated by the semiconductor chip, even in the case of short-wave, in particular blue or ultraviolet, radiation having a high intensity.

In a further preferred refinement of the invention, the semiconductor chip is embedded in an encapsulation compound. The encapsulation compound advantageously protects the semiconductor chip from harmful external influences, such as moisture.

In a further preferred refinement of the invention, the optoelectronic device is designed for generating mixed-colour, in particular white, light. In order to generate mixed-colour light, a luminescence conversion material, for instance a suitable phosphor, is arranged downstream of the semiconductor chip. The phosphor may be introduced as a powder, for example, into the encapsulation compound. The luminescence conversion material converts part of the radiation having a first wavelength that is generated by the semiconductor chip into radiation having a second wavelength, which is greater than the first wavelength. Mixed-colour, in particular white, light can be produced from the mixture of the radiation emitted by the semiconductor chip and the luminescence-converted radiation. Semiconductor chips which emit in the blue or ultraviolet spectral range are particularly suitable for generating white light. This radiation is converted into yellow radiation, for example, by a luminescence conversion material.

In a further preferred refinement of the invention, the optical element is spaced apart from the encapsulation compound. The distance is preferably determined by the design of the apparatus or of the fixing elements. The apparatus and the optoelectronic device are particularly preferably coordinated with one another such that a defined distance between the optical element and the encapsulation compound is established after the fixing of the apparatus to the optoelectronic device.

In a further preferred refinement of the invention, the optical element adjoins the encapsulation compound. This makes it possible advantageously to reduce the size of the component and to increase the protection of the component from the penetration of impurities.

In one advantageous development of the invention, the optical element is held positionally stably relative to the semiconductor chip by the apparatus, in particular with respect to deformations of the encapsulation compound, during operation of the component. The risk of changes in the emission or reception characteristic of the component on account of positional changes of the optical element or deformations of the encapsulation compound can thereby be reduced.

The housing body of the optoelectronic device may for example contain a plastic and/or be produced by means of injection, transfer or compression moulding with a suitable moulding compound.

In one advantageous development of the invention, the apparatus and the housing body are substantially identical in terms of their composition or at least contain materials having similar coefficients of thermal expansion. Thermally dictated stresses between the apparatus and the housing body can thus largely be avoided, thereby increasing the stability of the component.

In a further preferred refinement of the invention, at least one fixing apparatus for fixing the apparatus to the housing body by means of the fixing element (s) is formed at the housing body. The number of fixing apparatuses preferably corresponds to that of the fixing elements, so that, in particular, a plurality of fixing apparatuses may be formed at the housing body. The fixing apparatus(es) is (are) preferably preformed at or in the housing body.

In a further preferred refinement of the invention, the apparatus is fixed to the housing body in particular by way of the fixing element (s), by means of a pressing, hot pressing, adhesive-bonding or riveted connection, in particular a thermal riveted connection.

In the case of a pressing connection, the fixing is essentially effected by means of mechanical force actions, in particular elastic forces, between fixing element and the housing body or the fixing apparatus. By way of example, fixing element and fixing apparatus are embodied for a press fit.

In the case of a hot pressing connection, the fixing element is integrally formed at the housing body or the fixing apparatus by means of thermal treatment in conjunction with mechanical force action. This may be effected for example by heating the fixing elements, so that the fixing element becomes plastically formable. In this case, the respective fixing element is preferably heated in such a way that the fixing element is plastically formable but not flowable. A mechanically stable fixing forms after the fixing element has cooled and solidified.

In the case of thermal riveted connection, the fixing element is integrally formed at the housing body or the fixing apparatus essentially purely thermally. In this case, the fixing element is preferably melted at least partially by heating above the melting point, is integrally formed at the housing body and hardens upon cooling. By means of the deformation with subsequent solidification, the fixing element is fixed to the housing body in a mechanically stable manner. The volume of the fixing element after fixing is preferably substantially equal to the volume before fixing.

The apparatus can be fixed to the housing body with or without an optical element, with an excessive thermal loading of the optical element preferably being avoided and corresponding thermostable optical elements preferably being used, respectively.

In one advantageous development of the invention, the fixing apparatus comprises at least one recess in the housing body that receives the fixing element of the apparatus.

In a further advantageous development of the invention, the fixing apparatus comprises at least one cutout in the housing body that receives the fixing element of the apparatus.

It should be noted that in the context of the invention, a recess of the housing is regarded as a recess which extends into the housing body from an entry area and does not have an exit area from the housing body. This is to be seen in contrast to a cutout, which extends through the housing body in such a way that it has an exit area that is different from the entry area. In this case, the exit area may be a surface opposite the entry area or a surface of the housing body that is adjacent to the entry area.

A recess is particularly suitable for a pressing, hot pressing or adhesive-bonding connection, and a cutout is particularly suitable for a thermal riveted connection.

In the case of a thermal riveted connection, by way of example, a fixing element that protrudes from the housing body on the part of the exit area of the cutout is heated in the protruding partial region, so that the fixing element is deformed or can be deformed and a mechanically stable riveted connection is formed between the apparatus and the housing body after deformation and subsequent cooling of the fixing element. This is preferably done prior to a surface mounting of the component on a printed circuit board. A fixing by means of a pressing, hot pressing or adhesive-bonding connection may also be carried out after the surface mounting of the optoelectronic device in a comparatively simple manner.

In a further preferred refinement of the invention, the optoelectronic device has a first connecting conductor and a second connecting conductor for making electrical contact with the semiconductor chip and also a thermal connecting part, which is preferably different from the connecting conductors. The connecting conductors are provided for example for soldering to the conductor tracks of a printed circuit board. Via the thermal connecting part, the heat arising during operation at the semiconductor chip can be dissipated efficiently from the semiconductor chip. Devices of this type are particularly suitable for high-power semiconductor chips which, during operation can generate a comparatively large amount of heat and radiation having a high intensity. By means of the apparatus, radiation-stable optical elements can be used in a simple manner even in the case of high-power components.

Further refinements, developments, advantages and expedients of the invention emerge from the description of the exemplary embodiments in conjunction with the figures.

DETAILED DESCRIPTION OF THE PREFFERRED EMBODIMENTS

Figure 1A:
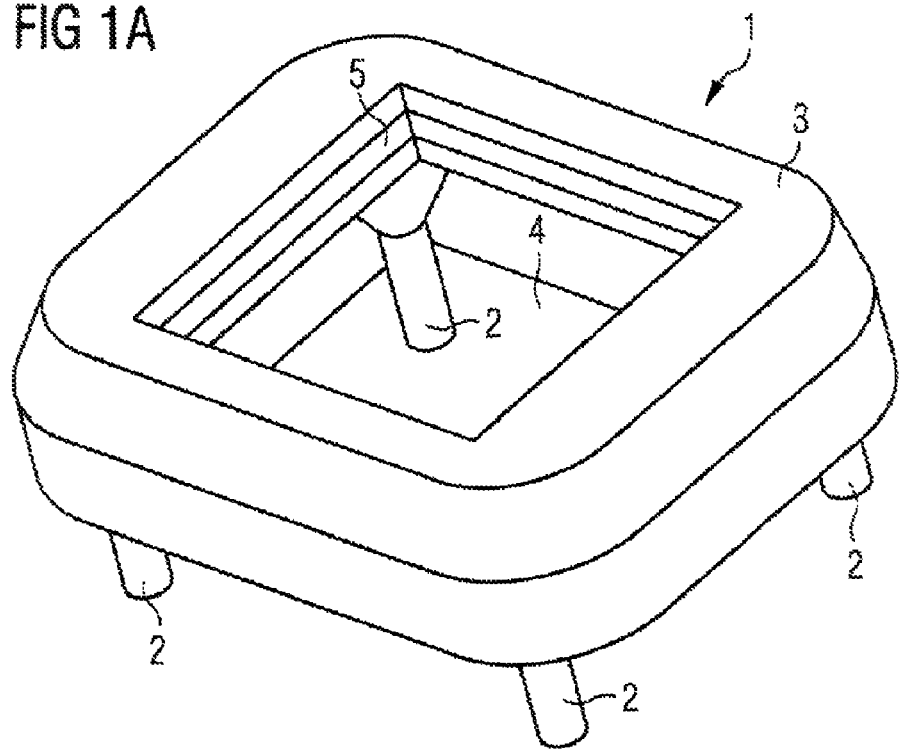
FIG. 1 shows a schematic illustration of a first exemplary embodiment of an apparatus according to the invention on the basis of a perspective oblique view from above in FIG. 1A and a perspective oblique view from below in FIG. 1B.
Figure 1B:
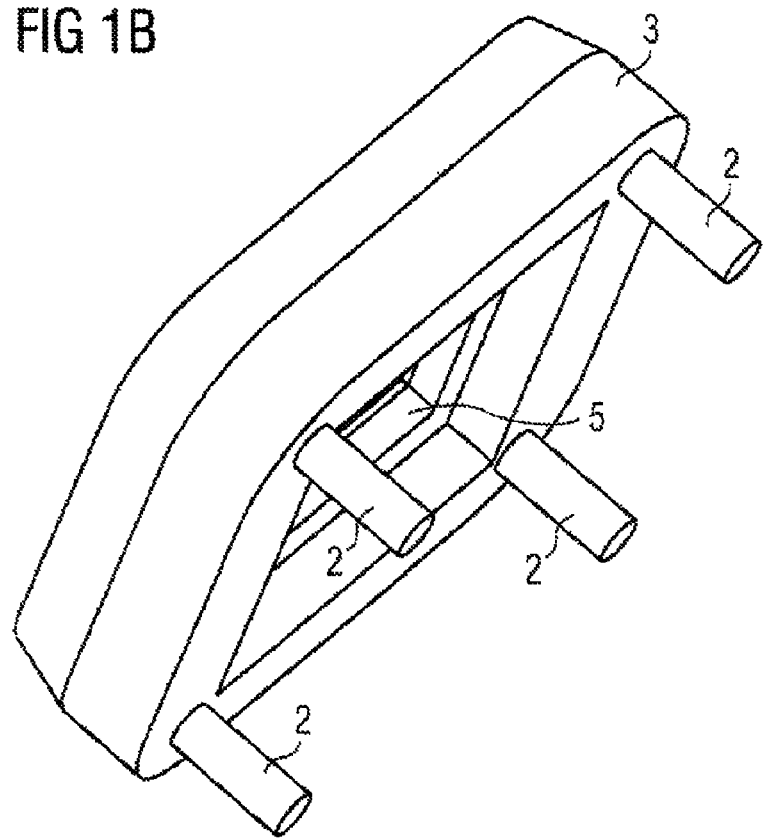

FIG. 1 schematically illustrates a first exemplary embodiment of an apparatus 1 according to the invention on the basis of a perspective oblique view from above in FIG. 1A and a perspective oblique view from below in FIG. 1B.

The apparatus 1 comprises a plurality of fixing elements 2, four in this exemplary embodiment, which are provided for fixing the apparatus to a housing body of an optoelectronic device. The apparatus is furthermore designed as a mount for a separate optical element. For this purpose, a mount device 5 for a separate optical element, preferably produced separately from the apparatus, is provided in a window 4 of the apparatus 1, said window being formed e.g. by cutting out from the frame 3. The window 4 may have for example a form corresponding to the frame, in particular rectangular or square. The fixing elements preferably emerge from corner regions of the frame 3.

The apparatus 1 preferably has an enveloping basic form which, in plan view, is essentially quadrangular, square or rectangular and is determined by a preferably one-piece, in particular closed, frame 3 from which the fixing elements 2 emerge. The fixing elements 2 are preferably embodied in pinlike fashion, for example as fitting pins.

The mount apparatus 5 is formed for example as a peripheral groove on the inner side in the frame. The fixing elements 2 are preferably formed in identical fashion and/or have a configuration that is characteristic of a respective fixing method, for instance adhesive bonding, pressing, hot pressing or riveting, intended for fixing the apparatus to the housing body.

As can be discerned in FIG. 1B, the fixing elements 2 are formed in an essentially cylindrical manner in this exemplary embodiment. Such a configuration of the fixing elements is particularly suitable for a pressing, hot pressing or thermal riveted connection to the housing body. For this purpose, the fixing elements preferably engage in fixing apparatuses correspondingly preformed in the housing body of the optoelectronic device.

The apparatus may be produced for example by means of injection, transfer or compression moulding with a suitable moulding compound, preferably a plastics material, for instance an acrylic- or epoxide-based plastics material. The form of the apparatus is determined by the moulds used in the respective moulding method. The apparatus may be formed in one piece, thereby forming an advantageously stable connection—in particular with respect to thermal stresses—between, the fixing elements and the frame. If appropriate, an optical element may already be held in the apparatus during the production of the apparatus, for instance by partial encapsulation by moulding.

The second exemplary embodiment of an apparatus according to the invention which is illustrated schematically in FIG. 2 on the basis of a perspective oblique view from below essentially corresponds to the exemplary embodiment shown in FIG. 1. Differences are apparent in the configuration of the fixing elements.

Figure 2:
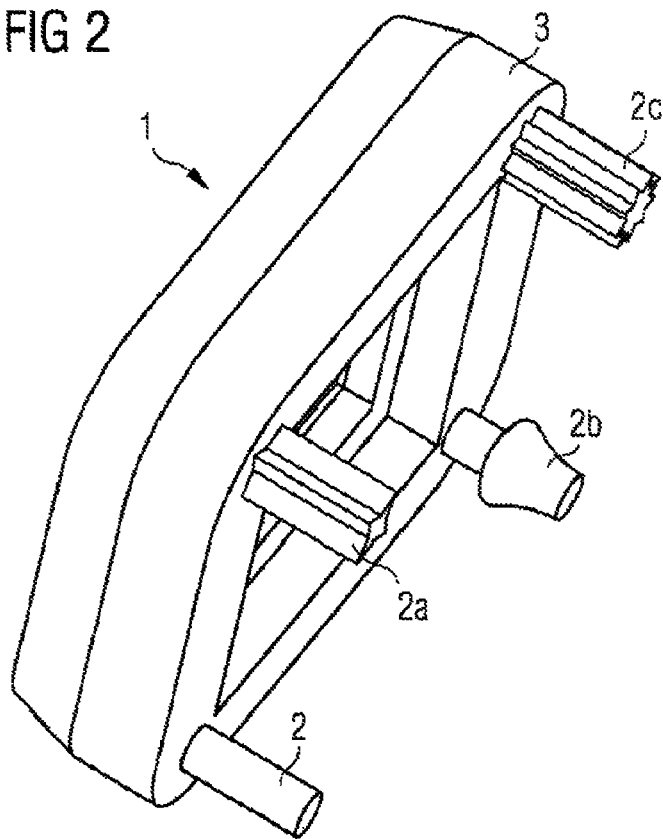
FIG. 2 shows a schematic illustration of a second exemplary embodiment of an apparatus according to the invention on the basis of a perspective oblique view from below.

The different configurations of the fixing elements in FIG. 2 serve in particular for illustrating possible embodiment variants. It is preferred, however, for the fixing elements of the apparatus all to be embodied in identical fashion.

The fixing element 2 is formed in an essentially cylindrical manner as in FIG. 1 and is particularly suitable for a pressing, hot pressing or thermal riveted connection. The further fixing elements 2a, 2b and 2c have a structured surface and are particularly suitable for an adhesive-bonding connection between apparatus and housing body of the optoelectronic device. The surface of the fixing elements 2a, 2b and 2c is enlarged compared with the surface of the fixing element 2 by means of corresponding structuring. The structured surface may foe produced by means of corresponding moulds, suitable impression or mechanical thinning of preformed fixing elements. The surface may comprise for example indentations and/or bulges or grooves as structure.

The different types of fixing elements 2, 2a, 2b and 2c are preferably suitable for fixing to fixing apparatuses of the housing body that are formed in identical fashion. The production of the housing body with the fixing apparatuses may thus advantageously foe effected independently of the formation of the fixing elements.

A large surface of the fixing element offers an Advantageously large adhesion-promoting area between fixing element and adhesive, as a result of which the mechanical stability of the fixing of the apparatus to the housing body is advantageously increased.

Figure 3:
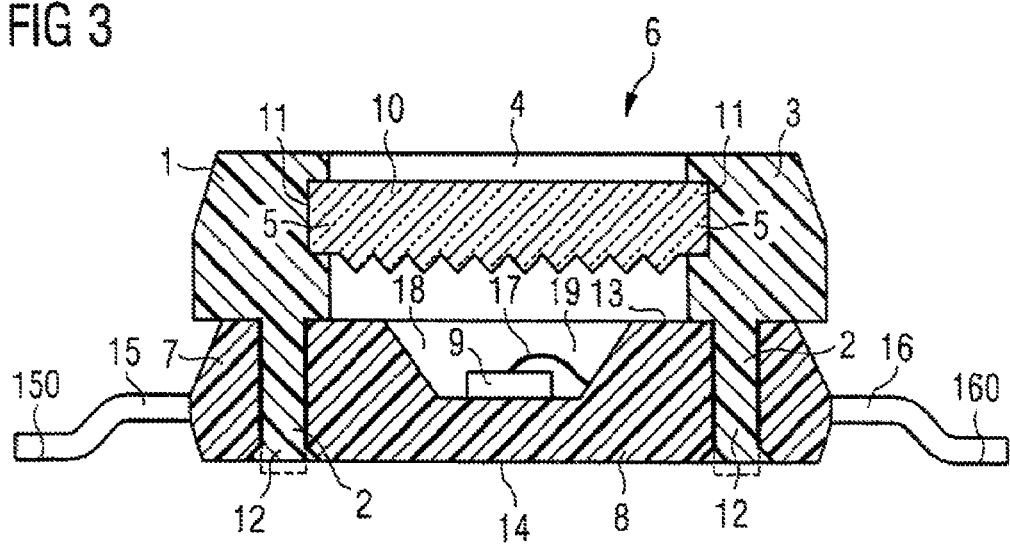
FIG. 3 shows a first exemplary embodiment of a component according to the invention on the basis of a schematic sectional view.

FIG. 3 schematically illustrates a first exemplary embodiment of a component 6 according to the invention on the basis of a sectional view.

The component 6 comprises an optoelectronic device 7, having a housing body 8, a semiconductor chip 9, and an apparatus 1 fixed to the housing body.

The apparatus may essentially be formed as in FIG. 1 or 2, an optical element 10 being held by the mount device 5 in FIG. 3, For this purpose, a mount element 11, e.g. a projection, of the optical element 10 engages into the mount apparatus 5, e.g. a groove.

During the mounting of the apparatus at the housing body, the fixing elements 2 of the apparatus are introduced into corresponding fixing apparatuses 12 of the housing body 8, which are preferably already formed during the production of the housing body.

In this exemplary embodiment, the fixing apparatuses 12 are formed as cutouts extending from a first main area 13 of the housing body through the housing body as far as a second main area 14 of the housing body, said second main area lying opposite the first main area.

Furthermore, the fixing apparatuses, in the same way as the fixing elements, are designed, for thermal riveting in this exemplary embodiment. In this case, the fixing element, after introduction into the fixing apparatus on the part of the second main area of the housing body 14, projects beyond the second main area, which is indicated, in a dashed manner in FIG. 3. In the protruding segment, of the fixing element 2, the fixing element is subsequently heated in such a way that it becomes flowable at least in this partial region. The flowable segment becomes integrally formed ("flows") onto the fixing apparatus, so that a mechanically stable fixing is formed after cooling and solidification of the fixing element.

If appropriate, the housing body may also be heated in the region adjoining the fixing apparatus on the part of the second main area, so that the housing body and the flowable fixing element fuse together.

The lateral extent of the fixing apparatus 12 is preferably greater than that of the fixing element 2 on the part of the second main area, and decreases in the direction of the first main area. The volume that is free after the introduction of the fixing element into the fixing apparatus is intended for receiving the material that projects beyond the second main area before the heating of the fixing element.

For this purpose, the fixing apparatus is formed, for example in the region adjoining the second main area of the housing body, preferably with a trapezoidal cross section tapering in the direction of the first main area and, after the tapering, essentially extends in cylindrical fashion in the direction of the first main area.

In order to increase the mechanical stability of the fixing of the apparatus to the housing body, the apparatus is preferably formed, or the fixing is effected, in such a way that the frame bears on the housing body on the part of the first main area thereof. The apparatus and the housing body are particularly preferably adapted to one another such that an essentially planar surface of the housing body is formed after the thermal riveting on the part of the second main area.

The optoelectronic device 7 has a first connecting conductor 15 and a second connecting conductor 16, which protrude from the housing body at, preferably different, side areas thereof. The connecting conductors are preferably to be formed as parts of a leadframe and serve for making electrical contact with the semiconductor chip, for example a luminescence diode chip. The semiconductor chip 9 may be electrically conductively connected to the first connecting conductor 15 via an electrically conductive adhesive-bonding or soldering connection and be fixed on said conductor. A bonding wire 17 serves for electrically conductive connection to the second connecting conductor 16. These conductive connections and the arrangement of the semiconductor chip on the connecting conductor 15 are not explicitly illustrated in FIG. 3.

The optoelectronic device may be produced by means of encapsulation by moulding, for instance using the injection moulding method, of a leadframe comprising the two connecting conductors 15 and 16 with a suitable moulding compound, for instance an epoxide- or acrylic-based plastics material. The housing body preferably has a cavity 18, in which the semiconductor chip 9 is arranged. Furthermore, an encapsulation compound 19, for instance containing a silicone, may be arranged in the cavity 18, which encapsulation compound is at least partially formed on or around the semiconductor chip and protects it from harmful external influences.

The optoelectronic device is preferably designed for the generation of radiation. The optoelectronic device 7 particularly preferably generates mixed-colour, in particular white, light and/or the semiconductor chip 9 is suitable for the generation of radiation in the ultraviolet or blue spectral range. For this purpose, the semiconductor chip is expediently based on GaN.

In order to generate mixed-colour light, part of the short-wave, blue or ultraviolet, radiation generated by the semiconductor chip excites a luminescence conversion material arranged in the encapsulation compound 19 for instance a phosphor, to emit longer-wave, e.g. yellow, radiation. Mixed-colour, in particular white light may consequently arise from the mixture of the radiation generated by the semiconductor chip and the radiation reemitted by the luminescence conversion material.

In order to increase the efficiency of the optoelectronic device, the walls of the recess may be coated with a reflection-enhancing material, for instance a metal.

Radiation generated by the optoelectronic device impinges on the optical element 10, which may be formed with an advantageous high UV stability on account of the apparatus and is made of glass, The optical element 10 serves for the beam shaping of the radiation impinging from the optoelectronic device and is designed for example as a refractive lens, for instance as a Fresnel lens. In FIG. 3, the beam shaping is effected by means of the Fresnel structure on that side of the optical element 10 which faces the semiconductor chip.

Preferably, the optical element 10 completely spans the window 4 and the region of the cavity, so that a maximum proportion of radiation generated by the optoelectronic device is accessible to the beam shaping by the optical element.

By means of a Fresnel-lens-like structure as shown in FIG. 3 on the side facing the semiconductor chip for instance, it is possible to achieve a parallelization in a parallel bundle of the radiation emitted by the component.

The risk of changes in the radiation emission properties, in particular the emitting characteristic, of the component is reduced on account of the mechanically stable connection of apparatus and housing body.

Furthermore, it is possible to use materials for the optical element which have a high UV stability and can be employed only with difficulty for conventional optoelectronic devices because, for instance, they adhere poorly on the encapsulation compound or have a coefficient of thermal expansion that deviates greatly from the encapsulation compound, so that the risk of a delamination of the adhesively bonded optical element from the encapsulation compound would be increased.

Differences in the coefficient of thermal expansion between the optical element and the apparatus can be taken into account in the configuration of the apparatus, in particular of the mount apparatus.

The risk of thermal stresses between the apparatus and the housing body can be reduced by using substantially identical materials or at least materials having similar coefficients of thermal expansion for the housing body and the apparatus.

The component or the optoelectronic device is of surface mountable design in this exemplary embodiment. For this purpose, by way of example, the connecting conductors 15 and 16 are soldered on conductor tracks of a printed circuit board (not illustrated) on the part of soldering areas 150 and 160 of the connecting conductors 15 and 16, respectively.

In the case of a thermal riveting on the part of the second main area 14 of the housing body 8 as illustrated in FIG. 3, the apparatus is advantageously already fixed to the housing body before the mounting of the component on the printed circuit board, so that the component is surface mountable with the optoelectronic device and the thermally riveted apparatus.

Figure 4:
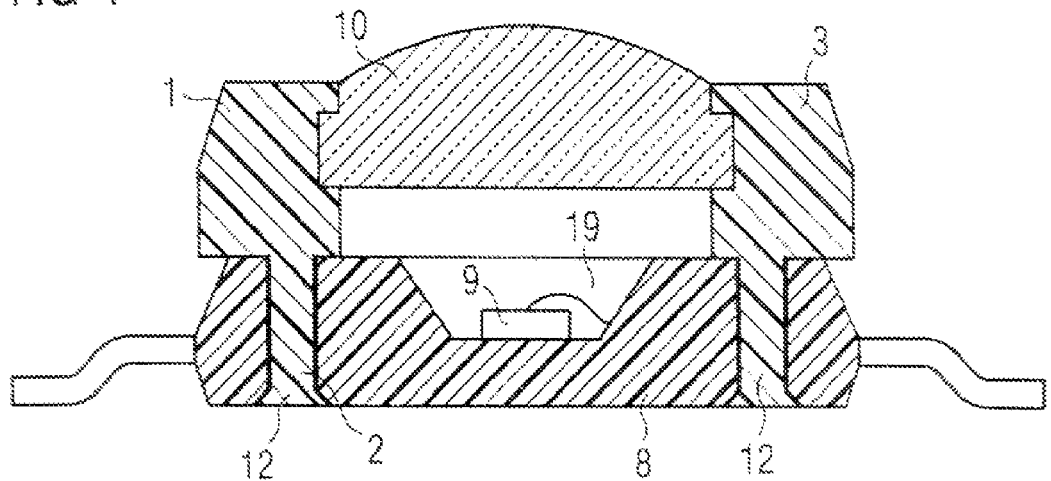
FIG. 4 shows a second exemplary embodiment of a component according to the invention on the basis of a schematic sectional view.

FIG. 4 schematically illustrates a second exemplary embodiment of a component according to the invention on the basis of a sectional view. This exemplary embodiment essentially corresponds to that shown in FIG. 3. in contrast thereto, in FIG. 4 provision is made of a refractive optical element 10, which is curved in the manner of a lens on the side remote from the semiconductor chip 9. On the part of the semiconductor chip 9, the optical element is preferably embodied essentially in planar fashion. By means of a lens of this type, it is possible to focus the radiation generated by the semiconductor chip, which is preferably arranged at the focal point, or radiation incident on said chip.

The optical element is illustrated as spaced apart from the housing body and the encapsulation compound 19 in FIG. 4.

If appropriate, however, the optical element may also be in direct contact with the housing body 8 and the encapsulation compound 19. In this case, the optical element is advantageously held stably by the apparatus in such a way that the relative position of optical elements and semiconductor chip remains essentially unchanged during operation of the component, in particular with respect to deformations of the encapsulation.

Furthermore, the apparatus may be formed such that in plan view its form essentially corresponds to that of the optoelectronic device. The image recognition of components of this type in automatic placement machines for arranging the components an a printed circuit board may thus advantageously be effected using the same process parameters as in the case of optoelectronic devices without an apparatus.

FIG. 6 schematically illustrates a third exemplary embodiment of a component according to the invention on the basis of a sectional view. Differences with respect to the exemplary embodiment in accordance with FIG. 3 are apparent in the Fresnel structure provided on the opposite side from the semiconductor chip and the way in which the apparatus is fixed to the housing body 8, The apparatus is fixed to the housing body 8 by means of a pressing connection. In this case, the fixing is effected by means of elastic forces between the housing body and the fixing element that is introduced into the fixing apparatus with press fit accuracy. The fixing apparatus 12 may be embodied for a pressing connection, in contrast to the illustration, not only as a cutout extending as far as the second main area 14 of the housing body, but also as a recess bounded by the housing body on the part of the second main area.

Compared with a thermal riveted connection, the apparatus can be fixed to the housing body in a simplified manner by means of a pressing connection after the mounting of the optoelectronic device on a printed circuit board. The same applies to an adhesive-bonding connection or a hot press connection, fixing after mounting facilitates the use of temperature-sensitive materials, such as thermoplastics for instance, for the apparatus or the optical element, which would possibly be dimensionally unstable at customary soldering temperatures, Furthermore, a fixing element designed for a thermal riveted connection is shortened in comparison with a fixing element designed for a pressing connection.

Figure 5:
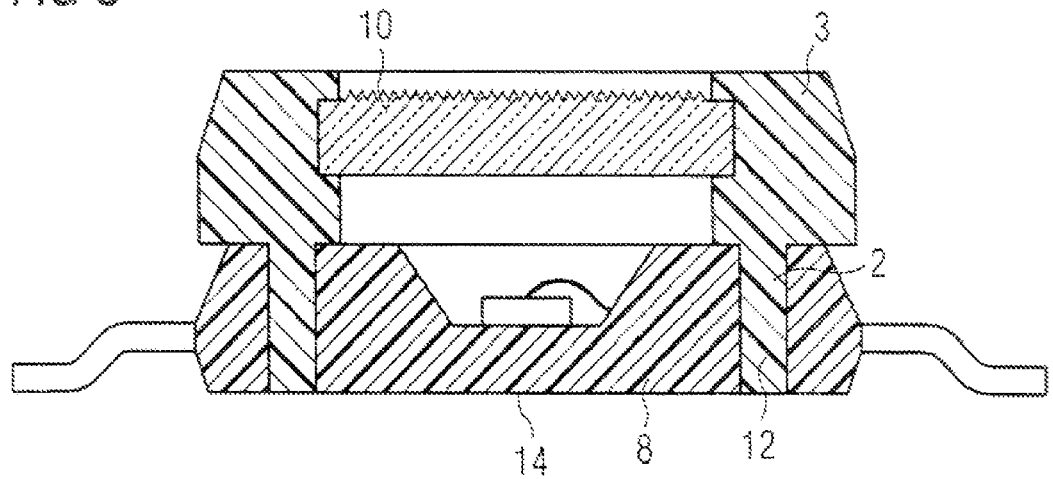
FIG. 5 shows a third exemplary embodiment of a component according to the invention on the basis of a schematic sectional view.

If the fixing is effected by means of an adhesive-bonding connection (not illustrated in FIG. 5), then the fixing apparatus is preferably embodied as a recess. A structured surface for instance in accordance with the fixing elements 2a, 2b and 2c from FIG. 2 advantageously enlarges the adhesion-promoting area with respect to an adhesive.

Furthermore, the optical elements may also foe designed as a diffractive element. For this purpose, provision is made for example of a carrier, for instance made of glass, to which a plurality of polymer layers are applied, into which a structure for the diffractive optic is stamped.

Figure 6A:
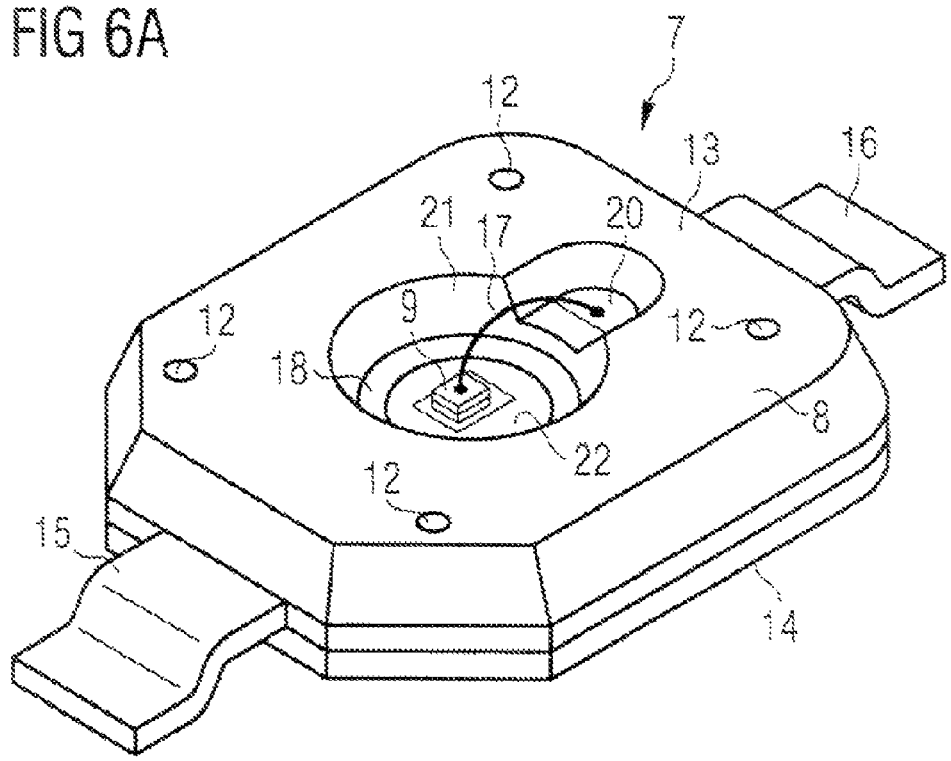
FIG. 6 shows a schematic illustration of a fourth exemplary embodiment of a component according to the invention on the basis of a perspective plan view of an optoelectronic device in FIG. 6A and a perspective sectional view in FIG. 6B.
Figure 6B:
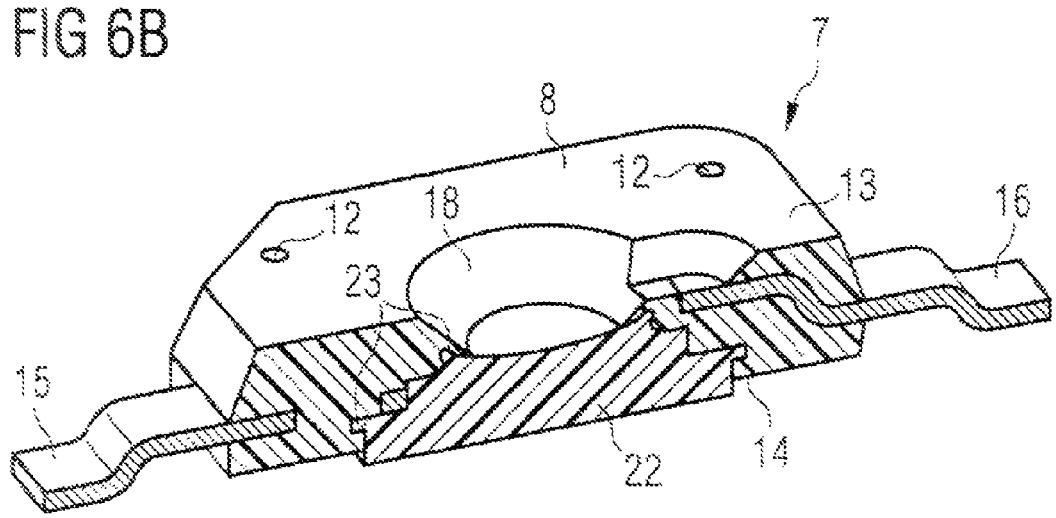

FIG. 6 schematically illustrates a fourth exemplary embodiment of a component according to the invention on the basis of a perspective plan view of an optoelectronic device in FIG. 6A and a perspective sectional view of the device in FIG. 6B. Optoelectronic devices of this type are described in more detail in WO 02/084749, for example, the disclosure content of which is hereby explicitly incorporated by reference in the present description.

The optoelectronic device 7 comprises a first connecting conductor 15 and a second connecting conductor 16, which protrude from the side areas of the housing body 8 of the optoelectronic device 7 and are formed for example like wings.

The housing body 8 has a cavity 18, in which the semiconductor chip 9 is arranged. The semiconductor chip 9 is electrically conductively connected to the connecting conductor 15 by means of a soldering connection, for example. A conductive connection to the second connecting conductor 16 is produced by means of the bonding wire 17. The bonding wire is preferably connected to the second connecting conductor 16 in the region of a bulge 20 of a wall 21 of the cavity 18.

The semiconductor chip 9 is arranged on a thermal connecting part 22, which functions as a chip carrier. The thermal connecting part extends in the vertical direction from the cavity as far as to the second main area 14 of the housing body 8 and advantageously facilitates a, preferably large-area, thermal connection of the semiconductor chip on the part of the second, main area to an external heat sink. The thermal loading on the housing body can thus be reduced particularly during operation of the device with a high-power semiconductor chip.

The thermal connecting part, is for example tied into a strap of the first connecting conductor 15 or connected, in some other way to the first connecting conductor, in particular in electrically conductive and/or mechanical fashion. The second connecting conductor 16, which is provided for making contact with the bonding wire, is preferably elevated with regard to the chip mounting plane of the semiconductor chip 9 on the thermal connecting part 22. That area of the wall of the cavity which, is available for a reflection of radiation is thus advantageously kept large. Furthermore, the thermal connecting part itself may be embodied in reflective fashion and then preferably forms part of the bottom or of the wall of the cavity. The thermal connecting part may furthermore protrude from the housing body on the part of the second main area or terminate essentially in planar fashion with the housing body. By way of example, the thermal connecting part contains a metal having a high thermal conductivity, for instance Cu or Al, or an alloy, for instance a CuWo alloy.

A leadframe having the two connecting conductors 15 and 16 and the thermal connecting part 22 may be encapsulated by moulding utilizing a suitable moulding method during the production of an optoelectronic device of this type. The thermal connecting part 22 is preferably formed with one or more dents or bulges 23, thereby improving the mechanical linking of the thermal connecting part to the housing body and thus increasing the overall stability of the optoelectronic device.

Fixing apparatuses 12 are formed on the part of the first main area 13 of the housing body, and are provided for fixing the apparatus (not illustrated), which may be embodied for example in accordance with the previous figures. By way of example, four fixing apparatuses 12 may be provided for fixing the apparatus to the housing body 8.

Overall, an apparatus in accordance with the present invention enables the use of very radiation-stable optical elements and a high flexibility with regard to the configuration of the optical elements, which can additionally be increased through a reversible fixing or mounting of the optical elements at the apparatus, which permits the optical elements to be exchanged without damaging the mount. Furthermore, the alignment outlay for an optical element can be kept down since the relative position of the semiconductor chip and of the optical element with respect to one another is essentially already determined during the production of the housing body or the apparatus. An apparatus according to the invention is particularly suitable for a component designed as a flash light, for instance for application in a mobile telephone. A suitable optoelectronic device is, in particular, a device similar to that bearing the type designation IM W5SG (manufacturer: Osram Opto Semiconductor GmbH) or related devices from the same manufacturer.

The invention is not restricted by the description on the basis of the exemplary embodiments. Rather, the invention encompasses any new feature and also any combination of features, which, in particular, comprises any combination of features in the patent claims even if this feature or this combination itself is not explicitly specified in the patent claims or exemplary embodiments.

The invention claimed is:

1. Component having:
   an optoelectronic device, the optoelectronic device comprising at least one semiconductor chip and a housing body, the housing body defining a cavity in which the semiconductor chip is arranged and the housing body defining at least one recess or at least one cutout;
   a separate optical element; and
   an apparatus comprising at least one pin-like fixing element,
   wherein the separate optical element is mounted to the apparatus, the at least one pin-like fixing element of the apparatus is disposed in a respective recess or cutout defined by the housing body, and the at least one pin-like fixing element of the apparatus is fixed to the housing body by an adhesive-bonding connection.

2. Component according to claim 1, wherein the apparatus is dimensionally stable under the action of blue or ultraviolet radiation for the generation of which or for the reception of which the optoelectronic device is intended.

3. Component according to claim 1, wherein the optical element is stable with respect to obfuscation or discolorations under the action of blue or ultraviolet radiation for the generation of which or for the reception of which the optoelectronic device is intended.

4. Component according to claim 1, wherein the optical element is a refractive element, a diffractive element or a dispersive element.

5. Component according to claim 1, wherein the optical element contains a glass, an epoxide material, a thermoplast, a polymer or urethane.

6. Component according to claim 1, wherein the optical element is fixed reversibly to the apparatus.

7. Component according to claim 1, wherein the optical element is fixed irreversibly to the apparatus.

8. Component according to claim 1, wherein the apparatus comprises a frame intended for receiving the optical element.

9. Component according to claim 8, wherein a groove is formed in the frame and configured to be engaged by a projection of the optical element.

10. Component according to claim 8, wherein the frame has in plan view a circular or polygonal enveloping basic form or a circular or polygonal contour.

11. Component according to claim 8, wherein the fixing element is arranged at the frame.

12. Component according to claim 1, wherein the apparatus is formed in one piece.

13. Component according to claim 1, wherein the apparatus is produced by means of injection moulding, compression moulding or transfer moulding.

14. Component according to claim 1, wherein the apparatus comprises a plurality of fixing elements.

15. Component according to claim 1, wherein the semiconductor chip is embedded in an encapsulation compound.

16. Component according to claim 15, wherein the optical element is spaced apart from the encapsulation compound.

17. Component according to claim 15, wherein the optical element adjoins the encapsulation compound.

18. Component according to claim 15, wherein the optical element is held positionally stably relative to the semiconductor chip by the apparatus with respect to deformations of the encapsulation compound, during operation of the component.

19. Component according claim 1, wherein the semiconductor chip is configured to generate radiation in the blue or ultraviolet spectral range.

20. Component according to claim 1, wherein the apparatus and the housing body are substantially identical in terms of their composition or contain materials having similar coefficients of thermal expansion.

21. Component according to claim 1, wherein the component and/or the optoelectronic device is of surface-mountable design.

22. Component according to claim 1, wherein the housing body is produced by means of injection moulding, compression moulding or transfer moulding.

23. Component according to claim 1, wherein the optoelectronic device has a first connecting conductor and a second connecting conductor for making electrical contact with the semiconductor chip and also a thermal connecting part.

24. Component according to claim 1, wherein the fixing element has a structured surface for the adhesive-bonding connection between the apparatus and the housing body of the optoelectronic device.

* * * * *

UNITED STATES PATENT AND TRADEMARK OFFICE
CERTIFICATE OF CORRECTION

| | | |
|---|---|---|
| PATENT NO. | : 7,948,694 B2 | Page 1 of 1 |
| APPLICATION NO. | : 11/574055 | |
| DATED | : May 24, 2011 | |
| INVENTOR(S) | : Georg Bogner et al. | |

It is certified that error appears in the above-identified patent and that said Letters Patent is hereby corrected as shown below:

Title page, Title (54), column 1, line 2, delete "COMPONNENT" and insert -- COMPONENT --.

Column 1, line 2, Title, delete "COMPONNENT" and insert -- COMPONENT --.

Column 1, line 7, delete "APPLECATIONS" and insert -- APPLICATIONS --.

Column 13, line 19, Claim 1, delete "having:" and insert -- having; --.

Signed and Sealed this
Nineteenth Day of July, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,948,694 B2 | Page 1 of 1 |
| APPLICATION NO. | : 11/574055 | |
| DATED | : May 24, 2011 | |
| INVENTOR(S) | : Georg Bogner et al. | |

It is certified that error appears in the above-identified patent and that said Letters Patent is hereby corrected as shown below:

Title page, item (73) Assignee, column 1, line 1, delete "Semiconductor" and insert
-- Semiconductors --.

Signed and Sealed this
Fifteenth Day of November, 2011

David J. Kappos
*Director of the United States Patent and Trademark Office*